United States Patent
Fujihara

(10) Patent No.: US 11,092,641 B2
(45) Date of Patent: Aug. 17, 2021

(54) INSPECTION APPARATUS AND INSPECTION METHOD

(71) Applicant: TOKYO ELECTRON LIMITED, Tokyo (JP)

(72) Inventor: Jun Fujihara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 160 days.

(21) Appl. No.: 16/569,728

(22) Filed: Sep. 13, 2019

(65) Prior Publication Data

US 2020/0096561 A1    Mar. 26, 2020

(30) Foreign Application Priority Data

Sep. 20, 2018    (JP) .............................. JP2018-176310

(51) Int. Cl.
| | |
|---|---|
| *G01R 31/26* | (2020.01) |
| *G01R 1/44* | (2006.01) |
| *G01R 31/28* | (2006.01) |
| *G01R 1/04* | (2006.01) |
| *G01R 1/073* | (2006.01) |

(52) U.S. Cl.
CPC ....... *G01R 31/2891* (2013.01); *G01R 1/0416* (2013.01); *G01R 1/07342* (2013.01); *G01R 31/2887* (2013.01)

(58) Field of Classification Search
CPC ............ G01R 31/2831; G01R 31/2849; G01R 31/2868; G01R 31/2874; G01R 31/2887; G01R 31/2891; G01R 31/2893; G01R 1/0416; G01R 1/07314; G01R 1/07342
See application file for complete search history.

(56) References Cited

U.S. PATENT DOCUMENTS

2008/0018352 A1* 1/2008 Chiba ................ G01R 31/2865
                                                         324/750.04

FOREIGN PATENT DOCUMENTS

| JP | H5175289 A | 7/1993 |
|---|---|---|
| JP | 2006-173206 A | 6/2006 |
| JP | 2010-266403 A | 11/2010 |

* cited by examiner

*Primary Examiner* — Minh N Tang
(74) *Attorney, Agent, or Firm* — Nath, Goldberg & Meyer; Jerald L. Meyer; Tanya E. Harkins

(57) ABSTRACT

An inspection apparatus includes: a stage on which an inspection target is mounted; a temperature adjustment mechanism configured to adjust a temperature of the stage; an inspecting part configured to exchange electrical signals for an electrical characteristics inspection with the inspection target; a probe card having terminals in contact with the inspection target; an intermediate connection member having connectors electrically connecting the inspecting part and the probe card; a position adjustment mechanism configured to adjust a relative position between the stage and the probe card; a temperature measurement member configured to measure a temperature of the intermediate connection member; a preliminary temperature adjusting part configured to adjust a temperature of the probe card prior to the electrical characteristics inspection; and a determining part configured to determine whether or not the temperature of the probe card is stabilized, based on the temperature of the intermediate connection member.

6 Claims, 6 Drawing Sheets

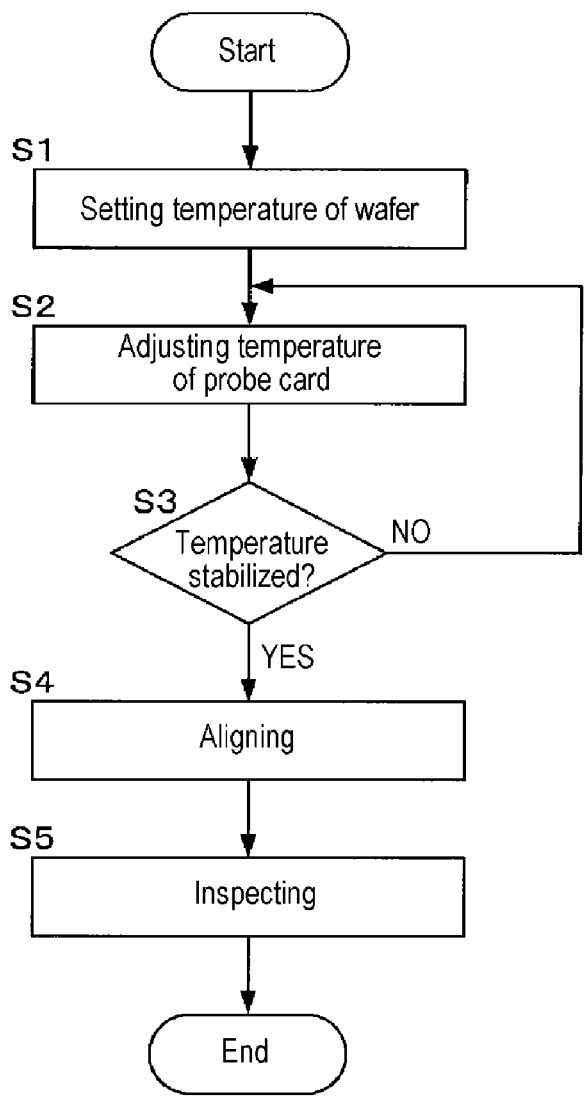

INSPECTION APPARATUS AND INSPECTION METHOD

CROSS-REFERENCE TO RELATED APPLICATION

This application is based upon and claims the benefit of priority from Japanese Patent Application No. 2018-176310, filed on Sep. 20, 2018, the entire contents of which are incorporated herein by reference.

TECHNICAL FIELD

The present disclosure relates to an inspection apparatus and an inspection method.

BACKGROUND

Patent Document 1 discloses an inspection method in which electrical measurement is conducted by bringing a plurality of probe needles arranged in a probe card into contact with temperature-controlled electrode pads of an inspection target. In this inspection method, a thermocouple as a temperature sensor and a heater are embedded in a needle fixing base provided on a lower surface of the probe card, and before the probe needles are brought into contact with the electrode pads, a temperature of the probe card is preliminarily adjusted to a temperature of the inspection target by using the thermocouple and the heater.

PRIOR ART DOCUMENT

Patent Document

Patent Document 1: Japanese laid-open publication No. H5-175289

SUMMARY

An aspect of the present disclosure provides an inspection apparatus for inspecting an inspection target. The inspection apparatus includes: a stage on which the inspection target is mounted; a temperature adjustment mechanism installed in the stage and configured to adjust a temperature of the stage; an inspecting part configured to exchange electrical signals for an electrical characteristics inspection with the inspection target; a probe card having terminals in contact with the inspection target during the electrical characteristics inspection; an intermediate connection member having connectors electrically connecting the inspecting part and the probe card, the intermediate connection member being located between the inspecting part and the probe card; a position adjustment mechanism configured to adjust a relative position between the stage and the probe card; a temperature measurement member installed in the intermediate connection member and configured to measure a temperature of the intermediate connection member; a preliminary temperature adjusting part configured to adjust a temperature of the probe card prior to the electrical characteristics inspection by controlling the temperature adjustment mechanism and the position adjustment mechanism; and a determining part configured to determine whether or not the temperature of the probe card is stabilized while the temperature of the probe card is adjusted by the preliminary temperature adjusting part, based on the temperature of the intermediate connection member measured by the temperature measurement member.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a flowchart for explaining an example of an inspection process using the inspection apparatus according to the embodiment.

DETAILED DESCRIPTION

Figure 1:
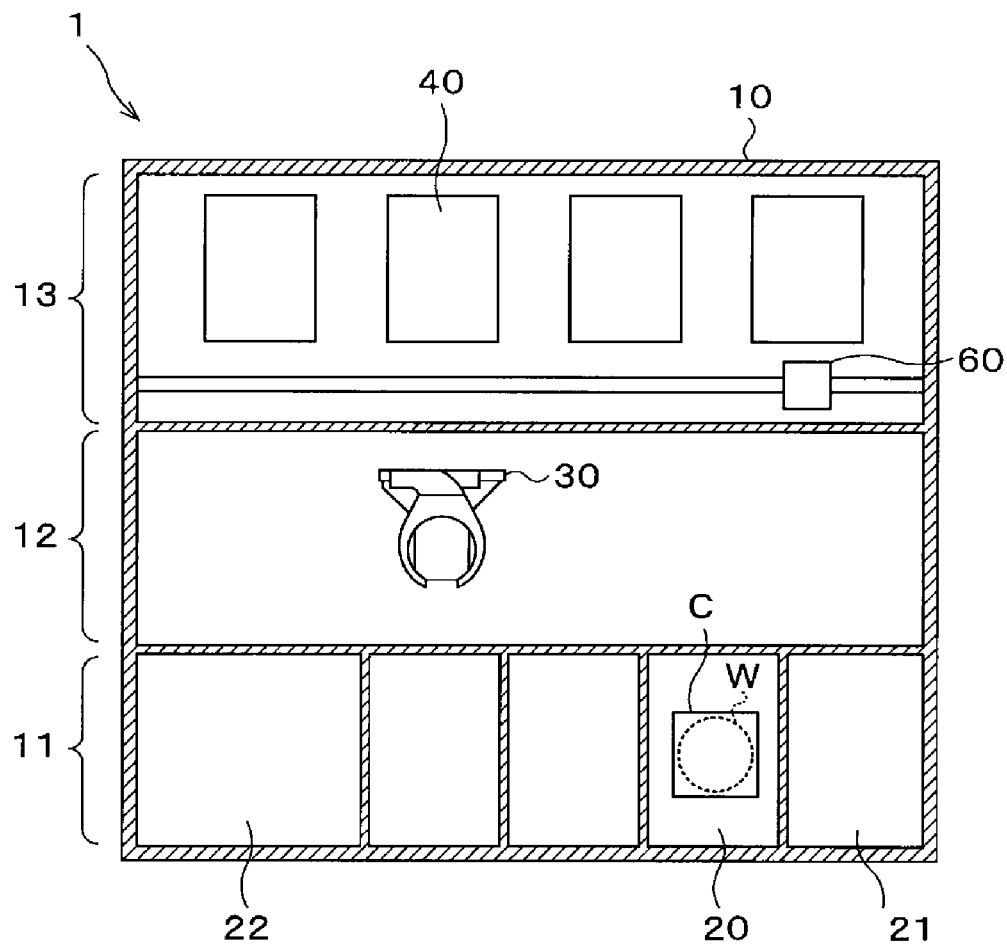
FIG. 1 is a transversal sectional top view schematically showing an outline of a configuration of an inspection apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor manufacturing process, a large number of electronic devices having predetermined circuit patterns are formed on a semiconductor wafer (hereinafter referred to as a "wafer"). The electronic devices thus formed are subjected to an electrical characteristics inspection and the like, and are classified into non-defective products and defective products. The inspection of the electronic devices is performed using an inspection apparatus, for example, before the electronic devices are divided from the wafer.

An inspection apparatus for electronic devices, which is called a prober or the like, includes a probe card having a plurality of probes as terminals. The inspection apparatus further includes a position alignment part and an inspection part. The position alignment part aligns positions of the probes of the probe card and electrodes of the electronic devices formed on the wafer, and brings the probes into contact with the electrodes. The inspection part exchanges electrical signals for the electrical characteristics inspection with the electronic devices via the probes. Based on the electrical signals from the electronic devices detected by the inspection part, it is determined whether or not the electronic devices are defective.

In the recent inspection apparatuses, a stage on which a wafer is mounted may be provided with a heater or a cooler so that the electrical characteristics inspection of the electronic devices can be performed at high temperature or low temperature.

When the electrical characteristics inspection of the electronic devices is performed at high temperature or low temperature, since the heat from the electronic devices, that is, the wafer, is transferred to the probe card including the probes, the wafer and the probe card thermally expand or shrink. However, since thermal expansion coefficients of the wafer and the probe card are different from each other, a relative position of the probes with respect to the electrode pads may deviate between normal temperature and high temperature or between normal temperature and low temperature, so that accurate electrical characteristics inspection cannot be performed at high temperature or low temperature.

On the other hand, in the inspection apparatus of Patent Document 1, a thermocouple and a heater are embedded in a needle fixing base provided on the lower surface of the probe card, and before the probe needles are brought into contact with the electrode pads, the temperature of the probe card is adjusted to the temperature of the inspection object using the thermocouple and the heater.

However, a plurality of types of probe cards may be used properly depending on the contents of the inspection, and even the same type of probe card is also replaced at predetermined time intervals. Therefore, as in Patent Document 1, the configuration in which the thermocouple and the heater are embedded in the probe card has room for improvement in terms of cost.

In some cases, a method may be employed in which, without providing a thermocouple or a heater in a probe card, the probe card is heated by a heater embedded in a stage via the stage for a predetermined time or more, so that the temperature of the probe card approximates the temperature of the inspection target. In this method, the predetermined time is set to be long in order to reliably prevent the relative position of the probes with respect to the electrode pads from deviating. However, when the predetermined time is set to be long, it takes a long time to start the electrical characteristics inspection.

The technique according to the present disclosure enables accurate electrical characteristics inspection under various temperature conditions at low cost and in a short time.

Hereinafter, an inspection apparatus and an inspection method according to an embodiment of the present disclosure will be described with reference to the drawings. Throughout the present disclosure and the drawings, elements having substantially the same functional configuration are denoted by the same reference numerals, and explanation thereof will not be repeated.

Figure 2:
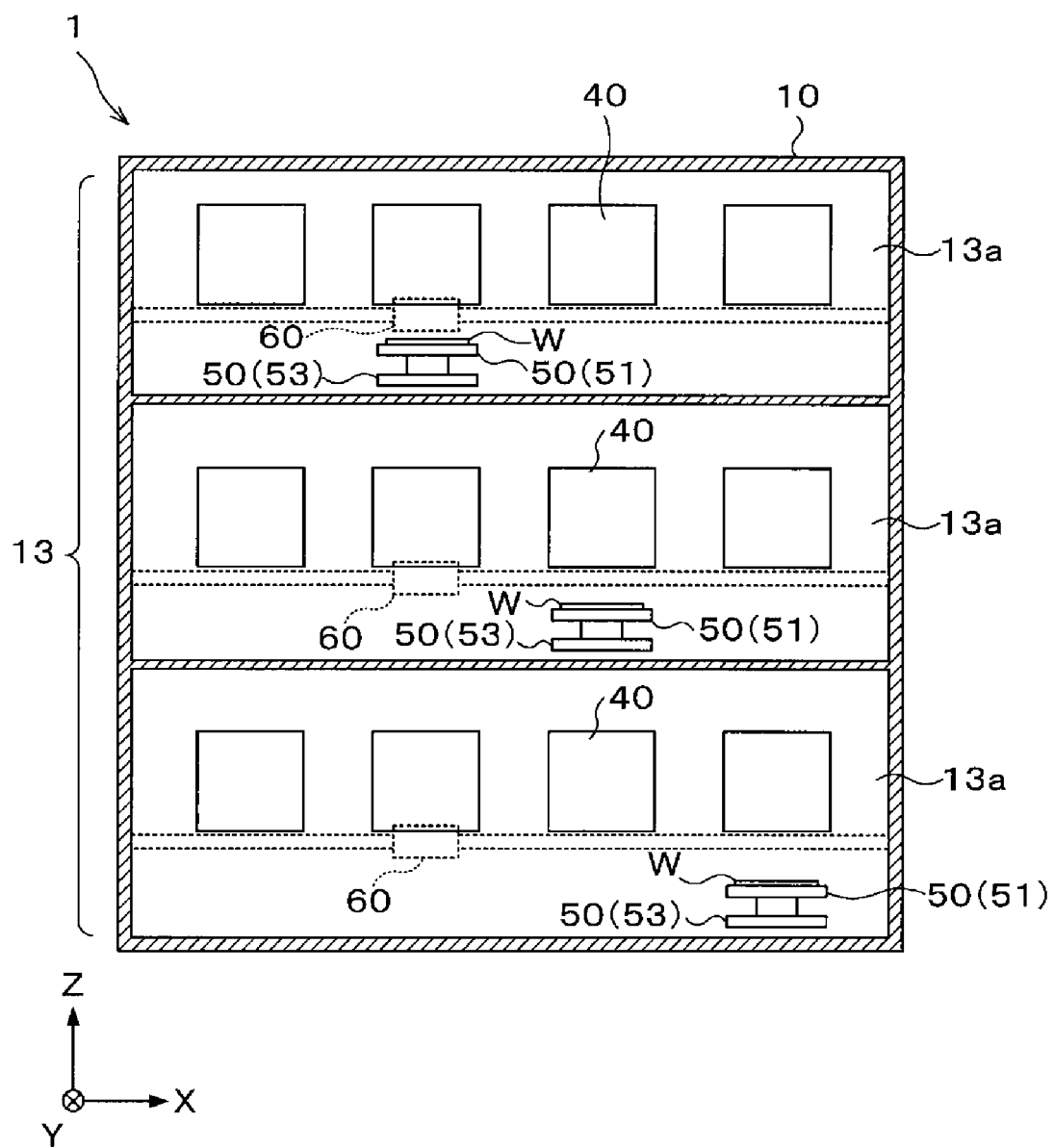
FIG. 2 is a longitudinal sectional front view showing an outline of a configuration of the inspection apparatus according to the embodiment.

FIGS. 1 and 2 are a transversal sectional top view and a longitudinal sectional front view, respectively, schematically showing the configuration of an inspection apparatus according to the present embodiment.

As shown in FIGS. 1 and 2, an inspection apparatus 1 has a housing 10 in which a loading and unloading area 11, a transfer area 12, and an inspection area 13 are defined. The loading and unloading area 11 is an area in which a wafer W as an inspection target is loaded into and unloaded from the inspection apparatus 1. The transfer area 12 is an area connecting the loading and unloading area 11 and the inspection area 13. The inspection area 13 is an area in which inspection of electrical characteristics of electronic devices formed on the wafer W is performed.

A port 20 that receives a cassette C accommodating a plurality of wafers W, a loader 21 that receives a probe card to be described later, and a controller 22 that controls respective components of the inspection apparatus 1 are disposed in the loading and unloading area 11.

A transfer device 30 which is freely movable with the wafer W held by the transfer device 30 is disposed in the transfer area 12. The transfer device 30 transfers the wafer W between the cassette C in the port 20 of the loading and unloading area 11 and the inspection area 13. Further, the transfer device 30 transfers one of probe cards, which is fixed to a pogo frame to be described later in the inspection area 13 and requires maintenance, to the loader 21 of the loading and unloading area 11. The transfer device 30 also transfers a new probe card or a probe card for which the maintenance is completed from the loader 21 to the pogo frame in the inspection area 13.

A plurality of testers 40 as an inspection part is disposed in the inspection area 13. Specifically, as shown in FIG. 2, the inspection area 13 is vertically divided into three division areas 13a, in each of which a tester line including four testers 40 arranged in a horizontal direction (X direction in FIGS. 1 and 2). A position aligning part 50 and a camera 60 are disposed in each division area 13a. The numbers and arrangement of testers 40, position aligning parts 50, and cameras 60 can be arbitrarily selected.

The tester 40 exchanges electrical signals for an electrical characteristics inspection with the wafer W. The position aligning part 50 places the wafer W on the position aligning part 50, and performs a position alignment between the wafer W placed on the position aligning part 50 and a probe card disposed below the tester 40. The position aligning part 50 is movable in an area below the tester 40.

The camera 60 moves horizontally and is located in front of each tester 40 in the division area 13a where the camera 60 is installed. Thus, the camera 60 images a positional relationship between the probe card disposed below the tester 40 and the wafer W placed on the position aligning part 50.

In the inspection apparatus 1, while the transfer device 30 is transferring one wafer W toward one tester 40, another testers 40 can perform an electrical characteristics inspection of electronic devices formed on another wafers W.

Figure 3:
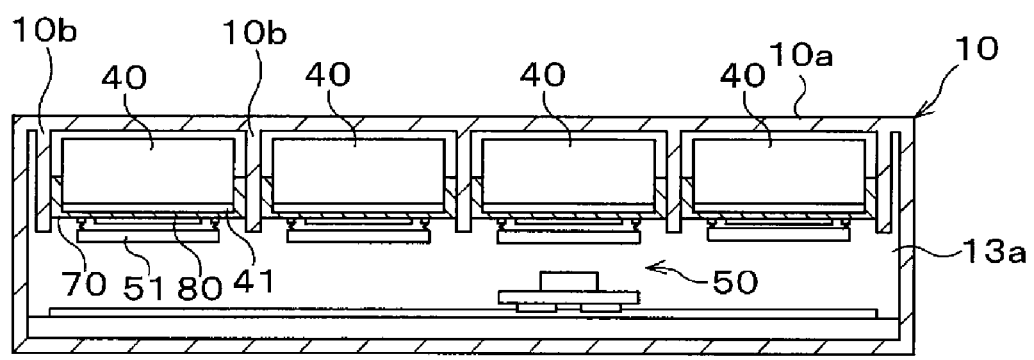
FIG. 3 is a longitudinal sectional front view showing a configuration in each divided area.
Figure 4:
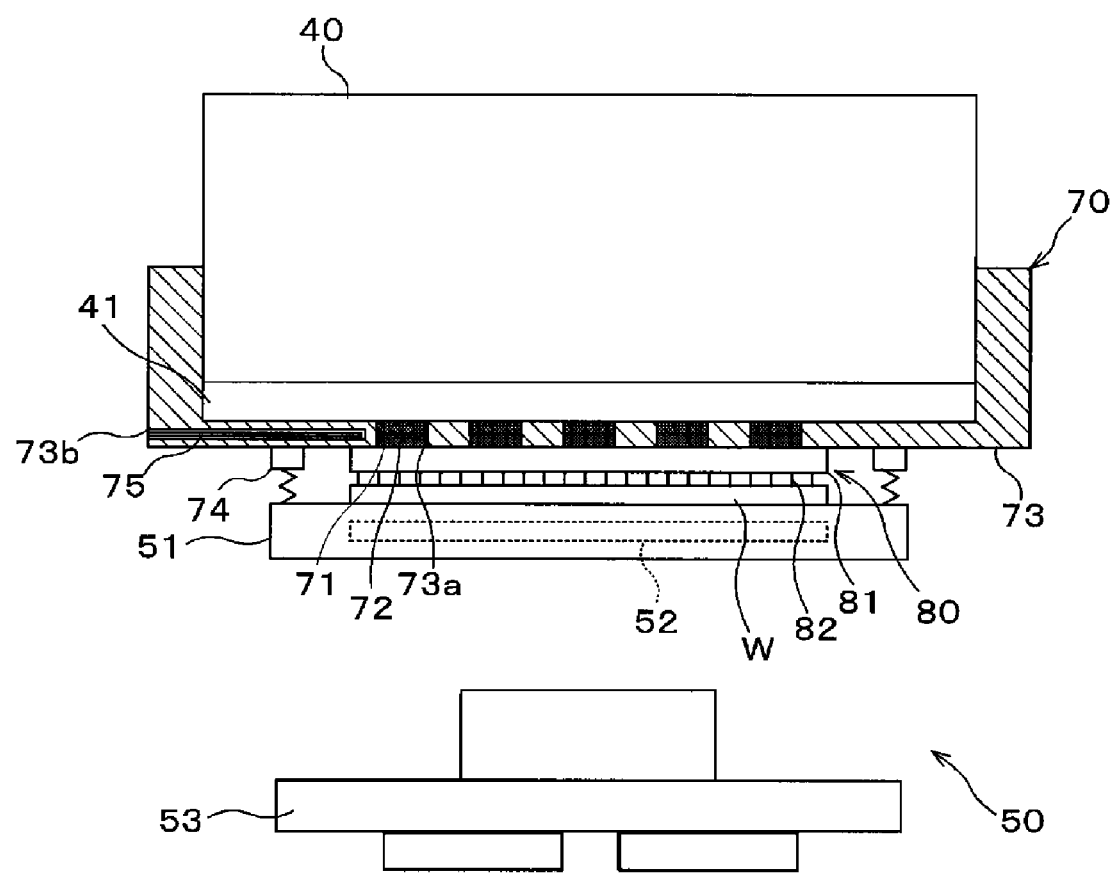
FIG. 4 is a partial enlarged view of FIG. 3.

Next, a configuration related to the tester 40 and the position aligning part 50 will be described with reference to FIGS. 3 and 4. FIG. 3 is a longitudinal sectional front view showing a configuration in each division area 13a. FIG. 4 is a partial enlarged view of FIG. 3.

As shown in FIGS. 3 and 4, the tester 40 has a tester motherboard 41 disposed horizontally in a bottom portion of the tester 40. A plurality of inspection circuit boards (not shown) is attached on the tester motherboard 41 in a standing state. Further, a plurality of electrodes is installed on a bottom surface of the tester motherboard 41.

Further, a pogo frame 70 as an intermediate connection member and a probe card 80 in this order from above are disposed below the tester 40.

Around the tester 40, a plurality of support walls 10b extends downward in the vertical direction from an upper wall 10a defining each division area 13a. The pogo frame 70 is attached to lower portions of two support walls 10b facing each other, and each tester 40 is supported by the two support walls 10b facing each other and the pogo frame 70 attached between the two support walls 10b.

The pogo frame 70 supports the probe card 80 and electrically connects the probe card 80 and the tester 40. The pogo frame 70 is disposed between the tester 40 and the probe card 80. The pogo frame 70 has pogo pins 71 as connectors for electrically connecting the tester 40 and the probe card 80. Specifically, the pogo frame 70 has pogo blocks 72, each of which holds a plurality of pogo pins 71, and a frame body 73 having attachment holes 73a in which the pogo pins 71 are attached by inserting the pogo blocks 72 to the attachment holes 73a. The frame body 73 is made of a high strength material having high rigidity and a small thermal expansion coefficient, such as a NiFe alloy. The NiFe alloy also enhances a thermal conductivity of the flame body 73.

The probe card 80 is vacuum-adsorbed on the lower surface of the pogo frame 70 in a state of being aligned at a predetermined location.

A bellows 74 extending vertically downward so as to surround the location where the probe card 80 is adsorbed is attached to the lower surface of the pogo frame 70. The bellows 74 forms a sealed space accommodating the probe card 80 and the wafer W in a state where the wafer W on a chuck top (to be described later) is brought into contact with probes (to be described later) of the probe card 80.

A temperature sensor 75 installed in the pogo frame 70 will be described later.

The lower end of each pogo pin 71 of the pogo frame 70 is in contact with the an electrode pad corresponding to a top surface of a card body 81 (to be described later) of the probe card 80 by a vacuum suction force acting on the pogo frame 70 and the probe card 80 by a vacuum mechanism (not shown). Further, the upper end of each pogo pin 71 is pressed against an electrode corresponding to the lower surface of the tester motherboard 41 by the vacuum suction force.

The probe card 80 has the disc-like card body 81, a plurality of electrode pads (not shown) disposed on the upper surface of the card body 81, and a plurality of probes 82, which are needle-like terminals, extending downward from the lower surface of the card body 81. The electrodes disposed on the upper surface of the card body 81 are electrically connected to the corresponding probes 82, respectively. Further, when the electrical characteristics inspection is performed, the probes 82 are brought into contact with electrode pads or solder bumps in the electronic devices formed on the wafer W, respectively. Therefore, when the electrical characteristics inspection is performed, electrical signals related to the inspection are exchanged between the tester motherboard 41 and the electronic devices on the wafer W via the pogo pins 71, the electrodes disposed on the upper surface of the card body 81, and the probes 82.

The position aligning part 50 is configured to mount a chuck top 51 as a stage on which the wafer W is mounted and adsorbed. A temperature adjustment mechanism 52 is embedded in the chuck top 51. When the electrical characteristics inspection is performed, the temperature adjustment mechanism 52 adjusts a temperature of the chuck top 51 such that the temperature during the electrical characteristics inspection of the wafer W mounted on the chuck top 51 is set to, for example, −30 degrees C. to +130 degrees C. The position aligning part 50 further has an aligner 53 as a position adjustment mechanism for supporting the chuck top 51 and moving the chuck top 51 in the vertical direction (Z direction in FIGS. 1 and 2), the front-rear direction (Y direction in FIGS. 1 and 2) and the horizontal direction (X direction in FIGS. 1 and 2).

In a state where the wafer W on the chuck top 51 is in contact with the probes 82 of the probe card 80 by the alignment by the position aligning part 50, a sealed space accommodating the probe card 80 and the wafer W is formed and is evacuated by a vacuum mechanism (not shown). At this time, by moving the aligner 53 downward, the chuck top 51 is separated from the aligner 53 and is adsorbed on the pogo frame 70.

In the inspection apparatus 1 having the above-described constituent members, the temperature sensor 75 as a temperature measurement part for measuring a temperature of the pogo frame 70 is installed in the pogo frame 70. Specifically, an insertion hole 73b passing through a portion in the pogo frame 70 above the probe card 80 is formed in the pogo frame 70, and the temperature sensor 75 including a thermocouple or the like is installed in the insertion hole 73b. The temperature sensor 75 measures a temperature of the portion in the pogo frame 70 located above the probe card 80. Since the upper and lower surfaces of the pogo frame 70 are occupied by other components, the insertion hole 73b extends horizontally from the side surface of the pogo frame 70 to the portion above the probe card 80. A plurality of temperature sensors 75 may be installed by changing a position or depth of the insertion hole 73b.

Figure 5:
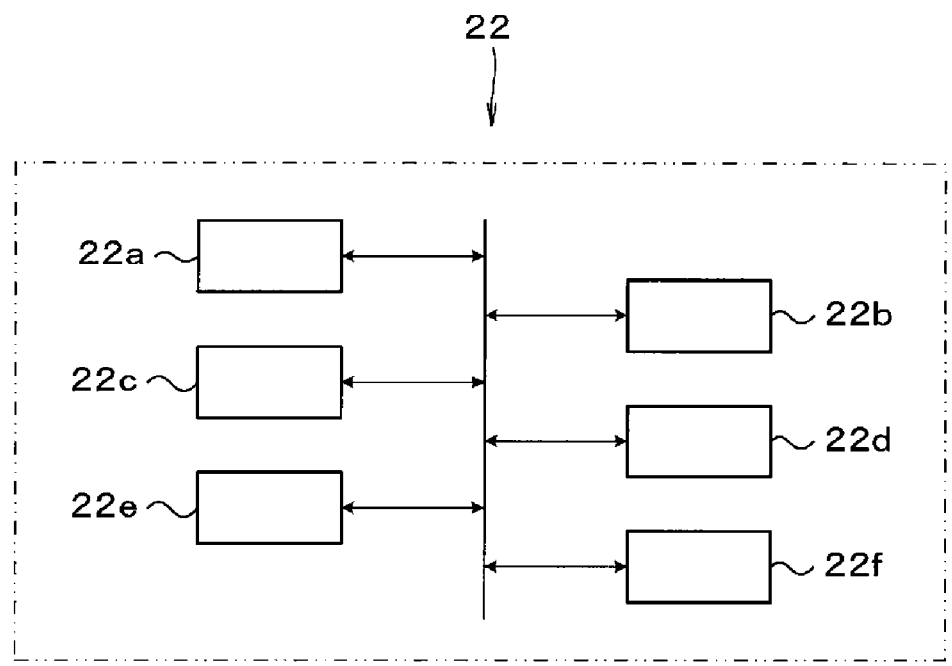
FIG. 5 is a block diagram schematically showing an outline of a configuration of a controller.

As described above, the inspection apparatus 1 includes the controller 22. FIG. 5 is a block diagram schematically showing a configuration of the controller 22.

The controller 22 is configured by, for example, a computer including a CPU, a memory, and the like, and has a program storage (not shown). The program storage stores a program for controlling various processes executed in the inspection apparatus 1. This program may be recorded in a computer-readable storage medium and may be installed in the controller 22 from the storage medium.

The controller 22 includes a storage part 22a, an inspection temperature adjusting part 22b, a temperature measurement result acquiring part 22c, a preliminary temperature adjusting part 22d, a determining part 22e and another determining part 22f.

The storage part 22a stores, for example, a set temperature of the wafer W for the electrical characteristics inspection.

When the inspection is performed, the inspection temperature adjusting part 22b controls the temperature adjustment mechanism 52 installed in the chuck top 51 such that the temperature of the wafer W mounted on the chuck top 51 is adjusted to a temperature corresponding to the set temperature stored in the storage part 22a.

The temperature measurement result acquiring part 22c acquires the measurement result from the temperature sensor 75 that measures the temperature of the pogo frame 70.

The preliminary temperature adjusting part 22d controls, prior to the electrical characteristics inspection, the temperature adjustment mechanism 52 and the aligner 53 such that the temperature of the probe card 80 is adjusted by the chuck top 51 having a temperature adjusted by the temperature adjustment mechanism 52.

The determining part 22e determines whether or not the temperature of the probe card 80 is stabilized when the temperature of the probe card 80 is adjusted by the preliminary temperature adjusting part 22d. Since the pogo frame 70 is made of a material with high thermal conductivity, the temperature of the pogo frame 70 at each time point corresponds to the temperature of the probe card 80. Therefore, the determining part 22e determines whether or not the temperature of the probe card 80 is stabilized, based on the measurement result of the temperature of the pogo frame 70 acquired by the temperature measurement result acquiring part 22c. As a result of the determination, when the temperature of the probe card 80 is stabilized, the inspection apparatus 1 starts the electrical characteristics inspection. The heat conductivity between the probe card 80 and the pogo frame 70 can be increased by increasing a contact area between the probe card 80 and the pogo frame 70, in particular, a contact area between the probe card 80 and the frame body 73 of the pogo frame 70.

The determining part 22f determines a state of the tester 40 based on the measurement result of the temperature of the pogo frame 70 acquired by the temperature measurement result acquiring part 22c.

When the determining part 22f determines that an abnormality occurs in the tester 40, the inspection apparatus 1 notifies information on the fact, that is to say, information on the state of the tester 40, using a notifying part (not shown).

Next, an inspection process using the inspection apparatus 1 will be described with reference to FIG. 6. FIG. 6 is a flowchart for explaining an example of the inspection process. In the following description, it is assumed that a process starts from a state where the chuck top 51 on which the wafer W is not mounted is attached to each of the testers 40, that is to say, each of the pogo frames 70.

(Temperature Setting)

When the electrical characteristics inspection is performed, first, the set temperature of the wafer W for the inspection is newly set or changed based on a user operation or the like (step S1). The set temperature of the wafer W for the electrical characteristics inspection is common to the division areas 13a.

(Preliminary Temperature Adjustment)

Then, prior to the electrical characteristics inspection, the temperature of the probe card 80 is adjusted by the preliminary temperature adjusting part 22d (step S2). Specifically, the preliminary temperature adjusting part 22d controls the temperature adjustment mechanism 52 such that the chuck top 51 on which no wafer W is mounted and which is attached to the pogo frame 70 is adjusted to a temperature (hereinafter referred to as a chuck top set temperature) corresponding to the set temperature of the wafer W for the electrical characteristics inspection. The temperature adjustment of the probe card 80 is performed by supply of heat from the temperature-adjusted chuck top 51 or absorption of heat by the chuck top 51.

(Determination)

During the temperature adjustment of the probe card 80, the determining part 22e determines whether or not the temperature of the probe card 80 is stabilized, based on the measurement result of the temperature of the pogo frame 70 by the temperature sensor 75 (step S3). For example, when the temperature change per unit time of the pogo frame 70 measured by the temperature sensor 75 (specifically, the absolute value of the temperature change) becomes equal to or less than a threshold value, the determining part 22e determines that the temperature of the probe card 80 is stabilized. In addition, when the temperature of the pogo frame 70 measured by the temperature sensor 75 reaches a predetermined temperature corresponding to the chuck top set temperature for the electrical characteristics inspection, the determining part 22e determines that the temperature of the probe card 80 is stabilized.

When the determining part 22e determines that the temperature of the probe card 80 is not stabilized ("NO" in step S3), the process returns to step S2 and the temperature adjustment of the probe card 80 continues.

On the other hand, when the determining part 22e determines that the temperature of the probe card 80 is stabilized ("YES" in step S3), the aligner 53 and the vacuum mechanism (not shown) are controlled, and the chuck top 51 is returned to the aligner 53, and the preliminary temperature adjustment of the probe card 80 ends.

(Position Alignment)

After the temperature of the probe card 80 is adjusted, position alignment between the wafer W as an inspection target and the probe card 80 is performed (step S4). Specifically, the transfer device 30 is controlled to take the wafer W out from the cassette C in the port 20 of the loading and unloading area 11 load the wafer W into the inspection area 13, and mount the wafer W on the chuck top 51. Then, the aligner 53 and the camera 60 are controlled to perform position alignment between the wafer W on the chuck top 51 and the probe card 80 in the horizontal direction. Subsequently, the chuck top 51 is moved upward until the electrodes of the electronic devices formed on the wafer W are brought into contact with the probes 82 of the probe card 80. Thereafter, in a state where the probes 82 are in contact with the electrodes, the vacuum mechanism (not shown) and the like are controlled and the aligner 53 is moved downward. Thus, the chuck top 51 is separated and adsorbed on the pogo frame 70.

In addition, before the electrodes of the electronic devices are brought into contact with the probe 82, the temperature adjustment mechanism 52 is controlled to adjust the temperature of the wafer W to the set temperature of the wafer W for the electrical characteristics inspection.

(Inspection)

Then, electrical signals for an electrical characteristics inspection are input from the tester 40 to the probes 82 via the pogo pins 71, and the electrical characteristics inspection of the electronic devices is started (step S5). During the inspection, the inspection temperature adjusting part 22b controls the temperature adjustment mechanism 52 to adjust the temperature of the wafer W mounted on the chuck top 51 to the set temperature stored in the storage part 22a. When the electrical characteristics inspection is completed, the aligner 53 and the transfer device 30 are controlled to return the wafer W to the cassette C in the port 20.

During the inspection of one wafer W by one tester 40, the aligner 53 transfers another wafer W to another tester 40 or collects another wafer W from another tester 40.

In the inspection process using the inspection apparatus 1, during the temperature adjustment of the probe card 80 performed before the inspection and/or during the inspection, the determining part 22f determines whether or not an abnormality occurs in the tester 40, based on the temperature of the pogo frame 70 measured by the temperature sensor 75.

When the temperature of the pogo frame 70 does not fall within a predetermined temperature range during the inspection or the like, it is considered that the following abnormality occurs in the tester 40. For example, due to a difference in thermal expansion coefficient between the pogo frame 70 and the tester motherboard 41 of the tester 40, there occurs an abnormality such as the relative position deviation between the pogo pin 71 and the electrodes on the lower surface of the tester motherboard 41.

Therefore, the determining part 22f determines whether or not an abnormality occurs in the tester 40 based on the temperature of the pogo frame 70 measured by the temperature sensor 75, and when an abnormality occurs, notification is performed by the notifying part (not shown).

As described above, according to the present embodiment, the temperature of the probe card 80 is adjusted by the temperature adjustment mechanism 52 installed in the chuck top 51, prior to the electrical characteristics inspection. Further, the determination as to whether or not the temperature of the pogo frame 70 is stabilized, that is to say, the determination of the end timing of the temperature adjustment of the probe card 80, is made based on the temperature of the pogo frame 70 measured by the temperature sensor 75 installed in the pogo frame 70. Therefore, it is not necessary to provide a temperature adjustment mechanism or a temperature measurement member in the probe card 80 which is a consumable product, and it is possible to set a time required for the temperature adjustment of the probe card 80 to an appropriate time length. Thus, accurate electrical characteristics inspection under various temperature conditions can be performed at low cost and in a short time.

Another method is conceivable in which a temperature measurement member is provided in a device frame such as the support wall 10b and the end timing of the temperature adjustment of the probe card 80 before the inspection is determined based on the measurement result of the temperature measurement member. This method can exclude the influence of the expansion and contraction due to the temperature change of the device frame. However, it takes a long time for the temperature adjustment of the probe card 80 before the inspection. According to the investigation by the present inventor, by determining the end timing of the temperature adjustment of the probe card 80 before the inspection based on the temperature measurement result of the pogo frame 70 as described above, it is possible to reduce the time required for the temperature adjustment to about ¼ as compared to the another method.

The effect of expansion and contraction due to the temperature change of the device frame described above, specifically, the effect of the expansion and contraction of the device frame on the parallelism of the aligner 53 and the probe card 80, can be excluded by providing the aligner 53 with a horizontal adjustment mechanism.

Further, in the present embodiment, determination on whether or not an abnormality occurs in the tester 40 uses the information on the temperature of the pogo frame 70, which is used for determining the end timing of the temperature adjustment of the probe card 80. That is to say, according to the present embodiment, the information on the temperature of the pogo frame 70 used for determining the end timing of the temperature adjustment of the probe card 80 is also used for determining whether or not an abnormality occurs in the tester 40.

It should be understood that the embodiments disclosed herein are illustrative and non-restrictive in every respect. The above embodiments may be omitted, substituted, or changed in various forms without departing from the scope of the appended claims and the subject matters thereof.

The following features are also within the technical scope of the present disclosure.

(1) An inspection apparatus for inspecting an inspection target, including:

a stage on which the inspection target is mounted;

a temperature adjustment mechanism installed in the stage and configured to adjust a temperature of the stage;

an inspecting part configured to exchange electrical signals for an electrical characteristics inspection with the inspection target;

a probe card having terminals in contact with the inspection target during the electrical characteristics inspection;

an intermediate connection member having connectors electrically connecting the inspecting part and the probe card, the intermediate connection member being located between the inspecting part and the probe card;

a position adjustment mechanism configured to adjust a relative position between the stage and the probe card;

a temperature measurement member installed in the intermediate connection member and configured to measure a temperature of the intermediate connection member;

a preliminary temperature adjusting part configured to adjust a temperature of the probe card prior to the electrical characteristics inspection by controlling the temperature adjustment mechanism and the position adjustment mechanism; and a determining part configured to determine whether or not the temperature of the probe card is stabilized while the temperature of the probe card is adjusted by the preliminary temperature adjusting part, based on the temperature of the intermediate connection member measured by the temperature measurement member.

According to the feature (1), the temperature adjustment of the probe card performed prior to the electrical characteristics inspection is performed by the temperature adjustment mechanism installed in the mounting part. Further, the determination on the temperature of the probe card is performed based on the measurement result of the temperature measurement member installed in the intermediate connection member. Therefore, it is not necessary to provide the probe card with a temperature adjustment mechanism or a temperature measurement member, and it is possible to set the time required for temperature adjustment of the probe card to an appropriate time length. Thus, accurate electrical characteristics inspection under various temperature conditions can be performed at low cost and in a short time.

(2) In the inspection apparatus having the feature (1), the intermediate connection member may have a frame body having attachment holes to which the connectors are attached, and the temperature measurement member may be installed in the frame body.

(3) In the inspection apparatus having the feature (1) or (2), the determining part may determine that the temperature of the probe card may be stabilized when a change in the temperature of the intermediate connection member measured by the temperature measurement member is equal to or less than a threshold value.

(4) In the inspection apparatus having the feature (1) or (2), the determining part may determine that the temperature of the probe card is stabilized when the temperature of the intermediate connection member measured by the temperature measurement member reaches a predetermined temperature.

(5) The inspection apparatus having any one of the features (1) to (4) may further include: another determining part configured to determine a state of the inspecting part based on the measurement result of the temperature measurement member, and a notification of information on the state of the inspecting part may performed based on the determination result of the another determining part.

(6) An inspection method for inspecting an inspection target using an inspection apparatus which includes: a stage on which the inspection target is mounted; a temperature adjustment mechanism installed in the stage and configured to adjust a temperature of the stage; an inspecting part configured to exchange electrical signals for an electrical characteristics inspection with the inspection target; a probe card having terminals in contact with the inspection target during the electrical characteristics inspection; an intermediate connection member having connectors configured to electrically connect the inspecting part and the probe card, the intermediate connection member being located between the inspecting part and the probe card; a position adjustment mechanism configured to adjust a relative position between the stage and the probe card; and a temperature measurement member installed in the intermediate connection member and configured to measure a temperature of the intermediate connection member, the inspection method including:

setting a temperature of the inspection target for the electrical characteristics inspection;

prior to the electrical characteristics inspection, adjusting a temperature of the probe card by controlling the temperature adjustment mechanism and the position adjustment mechanism according to the set temperature of the inspection target;

while the temperature of the probe card is adjusted in the adjusting the temperature of the probe card, determining whether or not the temperature of the probe card is stabilized, based on the temperature of the intermediate connection member measured by the temperature measurement member;

after the temperature of the probe card is determined to be stabilized, performing a position alignment of the probe card and the inspection target by controlling the position adjustment mechanism; and after the performing the position alignment of the probe card and the inspection target, performing the electrical characteristics inspection using the inspecting part.

According to the present disclosure in some embodiments, it is possible to perform accurate electrical characteristics inspection under various temperature conditions at low cost and in a short time.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An inspection apparatus for inspecting an inspection target, the apparatus comprising:
   a stage on which the inspection target is mounted;
   a temperature adjustment mechanism installed in the stage and configured to adjust a temperature of the stage;
   an inspecting part configured to exchange electrical signals for an electrical characteristics inspection with the inspection target;
   a probe card having terminals in contact with the inspection target during the electrical characteristics inspection;
   an intermediate connection member having connectors electrically connecting the inspecting part and the probe card, the intermediate connection member being located between the inspecting part and the probe card;
   a position adjustment mechanism configured to adjust a relative position between the stage and the probe card;
   a temperature measurement member installed in the intermediate connection member and configured to measure a temperature of the intermediate connection member;
   a preliminary temperature adjusting part configured to adjust a temperature of the probe card prior to the electrical characteristics inspection by controlling the temperature adjustment mechanism and the position adjustment mechanism; and
   a determining part configured to determine whether or not the temperature of the probe card is stabilized while the temperature of the probe card is adjusted by the preliminary temperature adjusting part, based on the temperature of the intermediate connection member measured by the temperature measurement member.

2. The inspection apparatus of claim 1, wherein the intermediate connection member has a frame body having attachment holes to which the connectors are attached, and the temperature measurement member is installed in the frame body.

3. The inspection apparatus of claim 1, wherein the determining part determines that the temperature of the probe card is stabilized when a change in the temperature of the intermediate connection member measured by the temperature measurement member is equal to or less than a threshold value.

4. The inspection apparatus of claim 1, wherein the determining part determines that the temperature of the probe card is stabilized when the temperature of the intermediate connection member measured by the temperature measurement member reaches a predetermined temperature.

5. The inspection apparatus of claim 1, further comprising another determining part configured to determine a state of the inspecting part based on the measurement result of the temperature measurement member, wherein a notification of information on the state of the inspecting part is performed based on the determination result of the another determining part.

6. An inspection method for inspecting an inspection target using an inspection apparatus which includes: a stage on which the inspection target is mounted; a temperature adjustment mechanism installed in the stage and configured to adjust a temperature of the stage; an inspecting part configured to exchange electrical signals for an electrical characteristics inspection with the inspection target; a probe card having terminals in contact with the inspection target during the electrical characteristics inspection; an intermediate connection member having connectors configured to electrically connect the inspecting part and the probe card, the intermediate connection member being located between the inspecting part and the probe card; a position adjustment mechanism configured to adjust a relative position between the stage and the probe card; and a temperature measurement member installed in the intermediate connection member and configured to measure a temperature of the intermediate connection member, the inspection method comprising:
   setting a temperature of the inspection target for the electrical characteristics inspection;
   prior to the electrical characteristics inspection, adjusting a temperature of the probe card by controlling the temperature adjustment mechanism and the position adjustment mechanism according to the set temperature of the inspection target;
   while the temperature of the probe card is adjusted in the adjusting the temperature of the probe card, determining whether or not the temperature of the probe card is stabilized, based on the temperature of the intermediate connection member measured by the temperature measurement member;
   after the temperature of the probe card is determined to be stabilized, performing a position alignment of the probe card and the inspection target by controlling the position adjustment mechanism; and
   after the performing the position alignment of the probe card and the inspection target, performing the electrical characteristics inspection using the inspecting part.

* * * * *